(12) United States Patent
Clem

(10) Patent No.: US 11,789,039 B2
(45) Date of Patent: Oct. 17, 2023

(54) ABSTRACTING OF DIGITAL ACQUISITION MEMORY

(71) Applicant: Tektronix, Inc., Beaverton, OR (US)

(72) Inventor: Jonathan D. Clem, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 196 days.

(21) Appl. No.: 16/222,839

(22) Filed: Dec. 17, 2018

(65) Prior Publication Data

US 2020/0191831 A1   Jun. 18, 2020

(51) Int. Cl.
*G01R 13/02* (2006.01)

(52) U.S. Cl.
CPC .................. *G01R 13/0254* (2013.01)

(58) Field of Classification Search
CPC ........... G01R 13/0254; G01R 13/0218; G01R 13/02; G01R 13/0272; G01R 13/00
See application file for complete search history.

(56) References Cited

U.S. PATENT DOCUMENTS

| | | | | |
|---|---|---|---|---|
| 6,812,688 B2 * | 11/2004 | Tan | ...................... | G01R 13/029 324/121 R |
| 8,942,300 B1 * | 1/2015 | Castro Scorsi | ......... | G06F 13/28 375/259 |
| 10,050,631 B1 * | 8/2018 | Schmidt | ............. | G01R 13/0254 |
| 2005/0140536 A1 * | 6/2005 | Waltari | .................. | H03M 1/144 341/162 |
| 2007/0118317 A1 * | 5/2007 | Corredoura | ........ | G01R 13/0254 702/79 |
| 2007/0200550 A1 * | 8/2007 | Corredoura | ........ | G01R 13/0254 324/121 R |
| 2009/0003502 A1 * | 1/2009 | Campiche | ................. | H04L 7/08 375/376 |
| 2011/0066402 A1 * | 3/2011 | Dobyns | .............. | G01R 31/3167 702/187 |
| 2012/0288044 A1 * | 11/2012 | Roberts | .................... | G06F 1/022 375/350 |
| 2017/0254835 A1 * | 9/2017 | Montijo | ............. | G01R 13/0254 |

* cited by examiner

*Primary Examiner* — Mohamed Charioui
(74) *Attorney, Agent, or Firm* — Miller Nash LLP; Andrew J. Harrington

(57) ABSTRACT

An abstracted digital memory acquisition circuit, including an analog input configured to receive an analog signal, an analog-to-digital converter configured to receive the analog signal and convert the analog signal to a first digital signal, a digital input configured to receive a second digital signal, a controller configured to receive the first digital signal and the second digital signal and output a stream of bits, the stream of bits including the first digital signal and the second digital signal, and a control signal, and an output configured to electrically connect to a digital input of a test and measurement instrument and output the stream of bits and the control signal.

20 Claims, 5 Drawing Sheets

ABSTRACTING OF DIGITAL ACQUISITION MEMORY

FIELD OF THE INVENTION

This disclosure is directed to systems and methods related to test and measurement systems, and in particular, to digital acquisition hardware that connects to a digital input of a test and measurement instrument.

BACKGROUND

Signal acquisition instrumentation can generally be classified into two major categories: oscilloscopes and data loggers. Oscilloscopes often offer better signal integrity, bandwidth, sample rate, etc., than data loggers, but are limited to a relatively small number of input channels. Data loggers, on the other hand, offer lower performance but many more input channels.

There are many applications that may benefit by using both types of instruments. For example, an industrial machinery manufacturer may need the performance and robust features of an oscilloscope on a small number of channels to capture high speed serial links within a product, but may also need a large number of lower performance basic channels to capture a large amount of low bandwidth machinery information, such as motor speeds, position encoders, analog-to-digital converters, digital-to-analog converters, etc., all time correlated and cross-triggered in the same acquisition. Currently, however, there is not a reasonable amount of integration between these two types of instruments to perform such a function.

Embodiments of the disclosure address these and other deficiencies of the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

Disclosed herein is an abstracted digital memory acquisition circuit to electrically connect between one or more devices under test and a test and measurement instrument. The abstracted digital memory acquisition circuit may include one or more analog inputs, each configured to receive an analog signal, as well as one or more analog-to-digital converters configured to receive the analog signal and convert the analog signal to a first digital signal, one or more digital inputs configured to receive a second digital signal, a controller configured to combine the digital signals, as well as a control signal, into a stream of bits, and an output configured to electrically connect to a digital input of a test and measurement instrument and output the stream of bits and the control signal.

Embodiments of the disclosure provide a way to abstract a digital channel acquisition memory of an instrument to utilize whatever native bandwidth is available in application specific configurations. Instead of a strict association of the digital acquisition memory with a set number of digital channels, the available bandwidth into acquisition memory can be distributed between multiple numbers and types, such as either analog or digital, of input channels. Post processing of the raw data acquisition memory allows dividing up and reconstructing waveforms.

Figure 1:
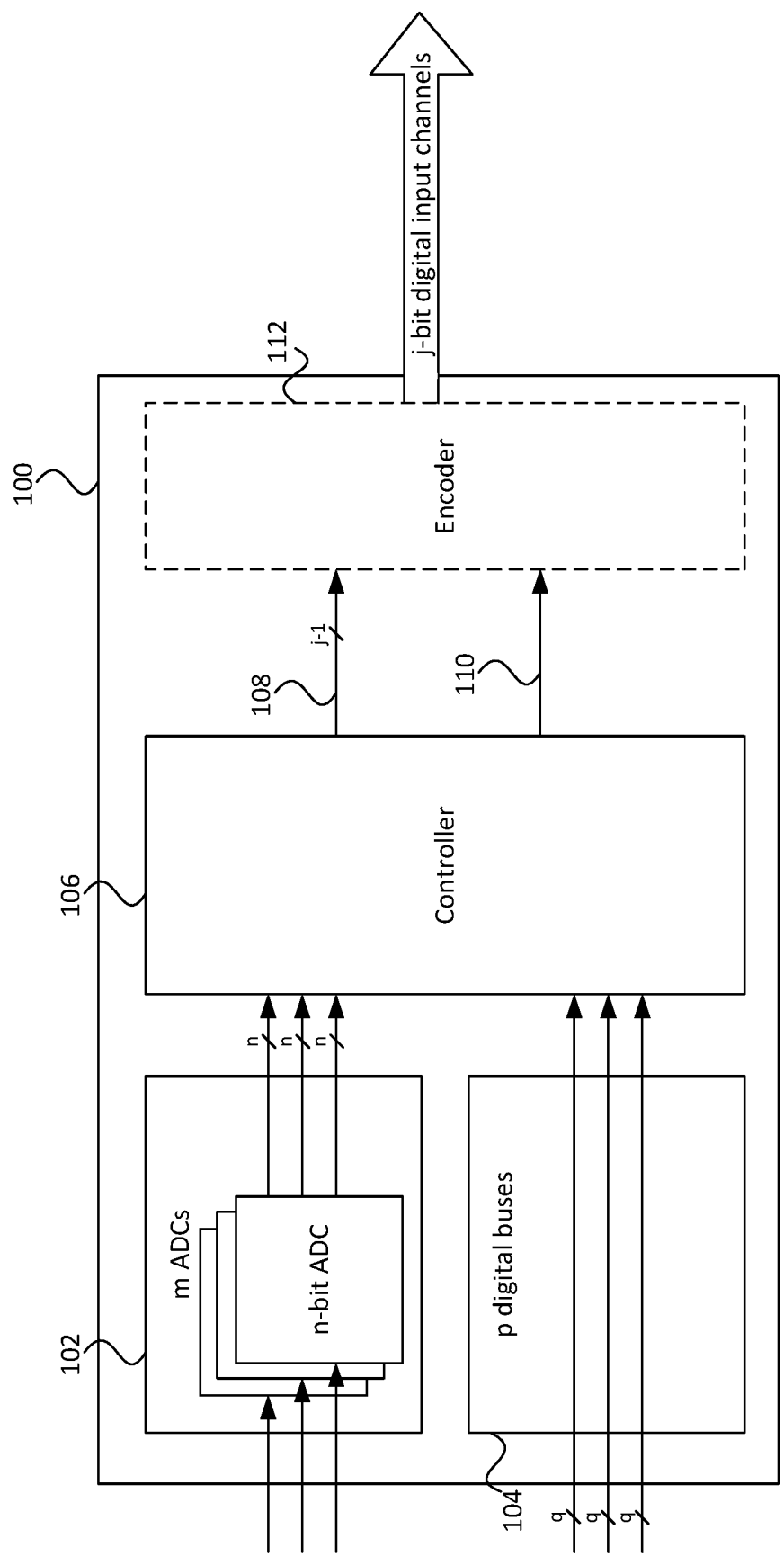
FIG. 1 is a block schematic diagram of an abstracted digital memory acquisition hardware according to some embodiments of the disclosure.

FIG. 1 illustrates an example block diagram of an abstracted digital memory (ADM) acquisition hardware 100. The ADM acquisition hardware 100 may be a pod, probe, module, or any other circuitry, to bridge between one or more devices under test and a test and measurement instrument. The ADM acquisition hardware 100 may be an integrated block in a circuit board of a user's device or may be an Application Specific Integrated Circuit (ASIC) or Field Programmable Gate Array (FPGA) driving a test and measurement instrument over a conventional digital probe, or it may be integrated into the test and measurement instrument itself. The ADM acquisition hardware 100 is advantageously abstracted to provide a protocol to framing real time acquisition data at a digital input of a test and measurement instrument that may allow arbitrary numbers (m and p) and arbitrary widths (n and q) of acquired entities. The arbitrary numbers, m and p, and arbitrary widths, n and q, may be one or greater.

As can be seen in FIG. 1, the ADM acquisition hardware 100 can include m number of analog-to-digital converters (ADCs) 102, each of which receives an analog signal from one or more devices under test. Each ADC 102 may be an n-bit ADC. The ADM acquisition hardware 100 may also include p number of digital buses 104, each digital bus configured to receive a q-bit digital signal from the one or more devices under test.

The ADM acquisition hardware 100 also may include a controller 106 to receive the digitized analog signals through the ADCs 102 and the digital signals through the digital buses 104. The controller 106 may include, for example, a multiplexer that time domain multiplexes the signals from the ADCs 102 and the signals through the digital buses 104 into a stream of bits 108. The controller 106 may also generate a control signal 110. The stream of bits 108 is one less than the number of bits available at the digital input channel of a test and measurement instrument, to allow the stream of bits 108 and the control signal 110 to be transmitted together to the test and measurement instrument 200. The control signal 110, as will be discussed in more detail below, identifies boundaries of a time domain multiplex (TDM) block of acquisition data. That is, the control signal 110 indicates a boundary of a TDM block of acquisition data, and each TDM block represents a single clock period of all the sampled signals in the ADM acquisition hardware 100. In some embodiments, the control signal 110 may also indicate a trigger, as will also be discussed in more detail below, which occurs in one of the sampled signals in the ADM acquisition hardware 100.

In some optional embodiments, the ADM acquisition hardware 100 may include an encoder 112 to encode the stream of bits 108 and the control signal 110 prior to being transmitted to a test and measurement instrument. The encoder 112 may encode the stream of bits 108 and the control signal 110 using either Manchester or non-return-to-zero mark (NRZM) encoding methods, for example. In such embodiments, isolated power should preferably be provided to the ADM acquisition hardware 100.

Figure 2:
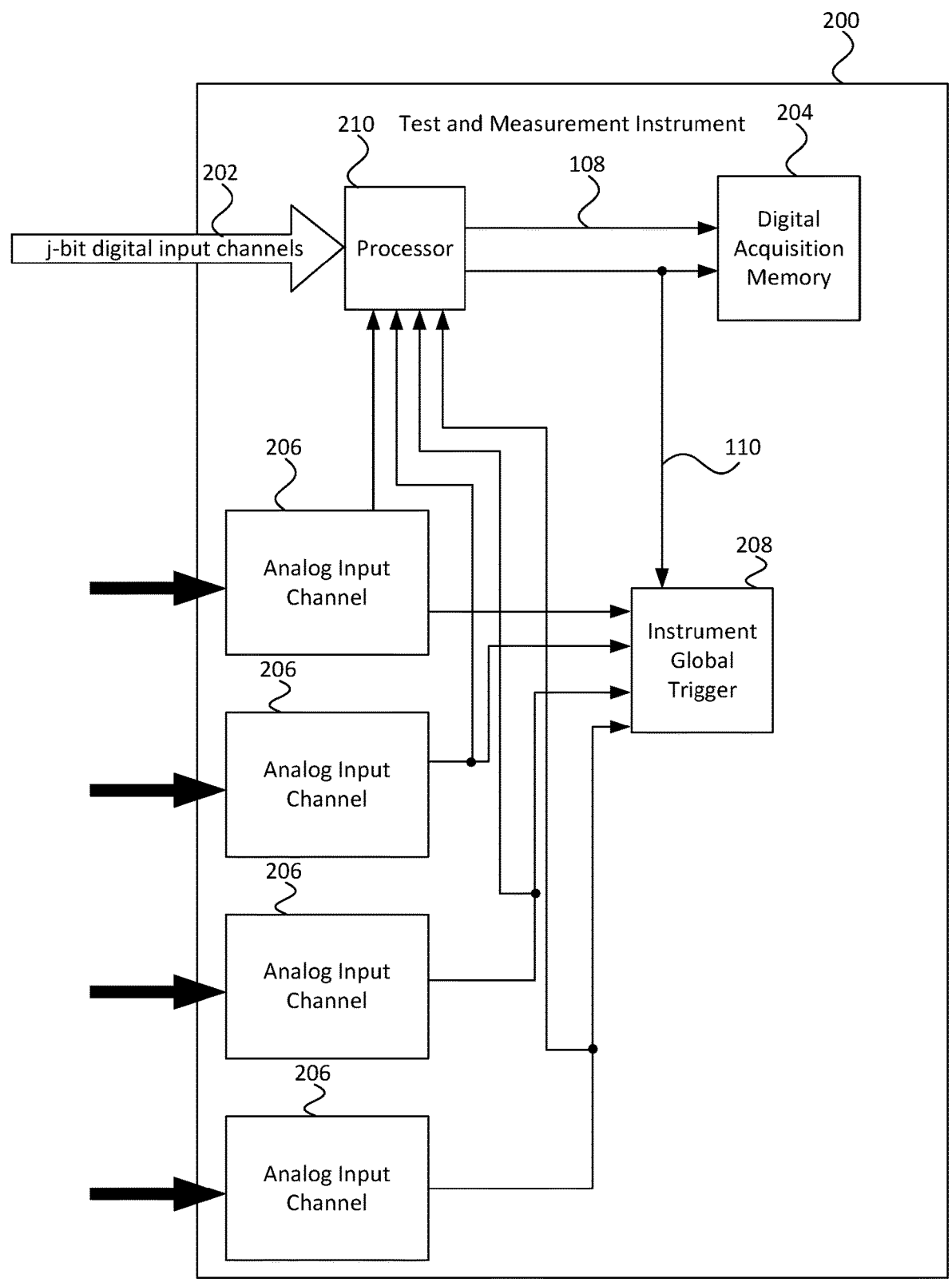
FIG. 2 is a block schematic diagram of a test and measurement instrument according to some embodiments of the disclosure

The ADM acquisition hardware 100 then transmits the stream of bits 108 and the control signal 110, either encoded or not, to a digital input channel of a test and measurement instrument 200, illustrated as a block diagram in FIG. 2. As will be readily understood by one skilled in the art, the test and measurement instrument 200 may include components additional to those shown in FIG. 2. For example, the test and measurement instrument 200 may include one or more processors, analog-to-digital converters, etc.

FIG. 2 illustrates an example block diagram of a test and measurement instrument 200 according to some embodiments of the disclosure. The test and measurement instrument 200 may be, for example, an oscilloscope, such as a mixed signal oscilloscope (MSO). The output from the ADM acquisition hardware 100 is received at one or more digital inputs 202 of the test and measurement instrument 200 and then are stored in a digital acquisition memory 204. The signal received at the digital inputs 202 may be processed by processor 210 prior to being stored in the digital acquisition memory 204. Each digital input 202 may be connected to a respective ADM acquisition hardware 100, or an ADM acquisition hardware 100 may have multiple outputs, each output connected to the one or more digital inputs 202, depending on the number of input bits allowed by the test and measurement instrument 200. The test and measurement instrument 200 may also include a number of analog input channels 206 to receive, for example, an analog signal from the one or more devices under test that require the higher performance and robust features, such as the full analog input bandwidth, of the test and measurement instrument 200 to be acquired. An analog input channel 206 may include a digitizer so that the output of the analog input channel 206 is a digitized signal. This allows the inputs of the test and measurement instrument 200 to be expanded, since only one digital input of the test and measurement instrument 200 is needed to receive the signals from the multiple inputs of the ADM acquisition hardware 100.

The control signal 110 and the output from each of the analog input channels 206, which may be digitized signals, are transmitted to an instrument global trigger 208. Prior to being transmitted to the instrument global trigger 208, the input signals may be processed through one or more processors 210 to separate the data waveforms 108 from the one or more devices under test and the control signal 110. This may be done before or after the data has been saved in the data acquisition memory 204. In FIG. 2, the test and measurement instrument 200 may process the digital input through one or more processors 210 prior to being stored in the data acquisition memory 204. However, in other embodiments, the data may be first stored in data acquisition memory 204 and then later processed by the one or more processors 204.

As will be understood by one skilled in the art, the instrument global trigger 208 may be included in the one or more processors 210 or may be included as a portion of another processor of the test and measurement instrument. When a trigger signal is present, the instrument global trigger 208 may be configured to begin an acquisition of one or more of the signals based on the trigger. Rules for the instrument global trigger 208 may be saved in a memory (not shown) of the test and measurement instrument 200, and may also be received from a user interface (not shown) of the test and measurement instrument 200 prior to being stored in the memory.

A user may set an external clock through the user interface upon which the one or more processors 210 can use to reconstruct the signals from the one or more devices under test. The external clock is set by the user based on the clock of the ADM acquisition hardware 100. In some embodiments, which will be discussed in further detail below, if the test and measurement instrument 200 is not capable of receiving an external clock, the test and measurement instrument 200 may use a method, such as an input synchronous decimation (ISD) method, to determine the external clock to use for reconstructing the waveforms from the ADM acquisition hardware 100.

As mentioned above, the control signal 110 indicates a boundary of a TDM block of acquisition data, and each TDM block represents a single clock period of all the sampled signals in the ADM acquisition hardware 100 and may also indicate a trigger condition.

As an example, the control signal 110 may freely toggle in a normal operation. This may ensure an adequate number of transitions in to support recovery of the external sample clock during post processing, even if the raw data being transmitted from the ADM acquisition hardware 100 to the test and measurement instrument 200 through the digital input channel 202 is static.

The control signal 110 may also be held static for a first number of consecutive clock samples, such as two samples, to indicate the boundary of a TDM block of acquisition data. Since a large number of bits are transferred, j–1 bits at a time, the post-processing performed by the processor 210 needs a reference point to know where to start assembling data for each external sample.

The control signal 110 may also indicate a trigger by holding the signal static for a second number of consecutive clock samples, which is different from the first number of consecutive clock samples used to indicate a TDM block boundary. For example, the number of consecutive clock samples for a trigger event may be one additional clock signal than the number of consecutive clocks samples that indicate the boundary. If such is the case, then each trigger will also indicate a boundary of a TDM block of acquisition data.

Figure 3:
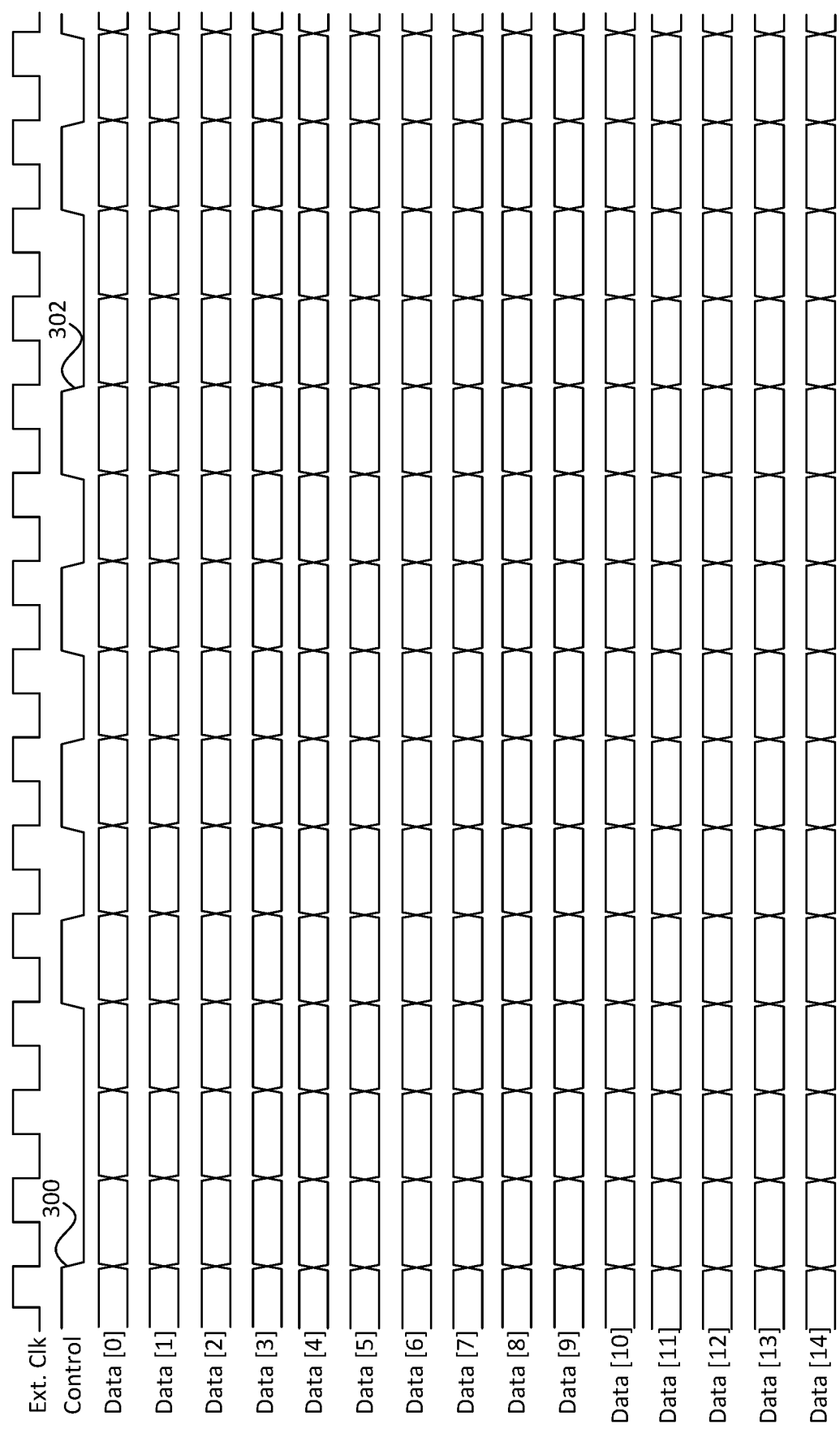
FIG. 3 is an example signal from the abstracted digital memory acquisition hardware of FIG. 1.

FIG. 3 illustrates an example of the organization and framing of data within the digital acquisition memory 204. In this example, 18 8-bit ADCs are being sampled in the ADM acquisition hardware 100. The ADM output frames all samples as illustrated and clocks the results out of the test and measurement 200. As can be seen, a trigger event is indicated at reference number 300, which also indicates the beginning boundary of a TDM block of acquisition data. Reference number 302 indicates the end of the current TDM block of acquisition data and a beginning of a new TDM block of acquisition data, because the control signal 110 has gone low again for two consecutive clock cycles.

Figure 4:
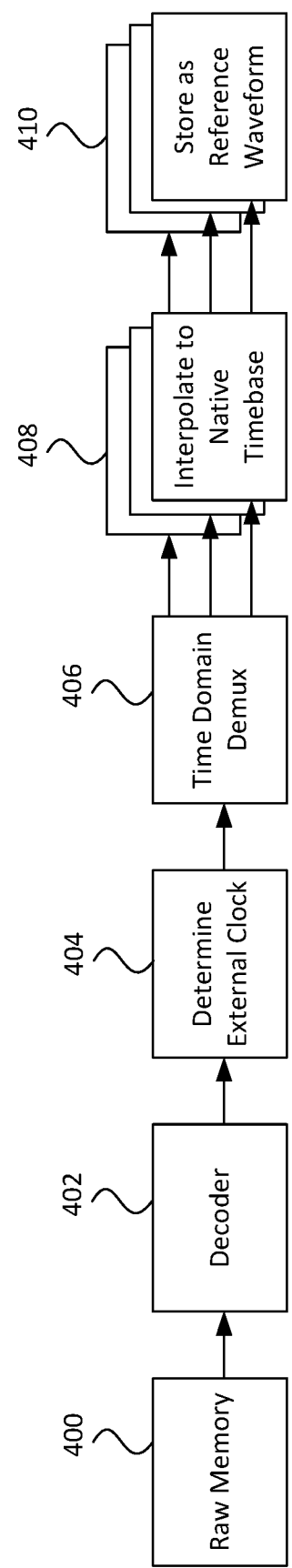
FIG. 4 is an example operation for processing an output of the abstracted digital memory acquisition hardware.

FIG. 4 is a block diagram illustrating the post processing of the data from the ADM acquisition hardware 100 at the test and measurement instrument 200. Initially, the raw data from the ADM acquisition hardware 100 may be saved in a memory 400, such as either digital acquisition memory 204 or another memory located in the test and measurement instrument 200 prior to being processed by the processor 210. The processor 210 then optionally decodes 402 the raw data if the data was originally encoded by the encoder 112 in the ADM acquisition hardware 100.

In operation 404, the processor 210 determines the external clock, which may either be received by the test and measurement instrument 200 through a user interface or may be determined by the test and measurement instrument, for example, using the ISD method for determining the external clock, which will be discussed in more detail below.

Once the external clock has been determined in operation 404, the signal is then time domain demultiplexed in operation 406 to the various different signals that were received at the ADM acquisition hardware 100. In operation 408, the signals are interpolated to the native timebase in the test and measurement instrument 200. Finally, in operation 410, the processor 210 stores the interpolated waveforms in the digital acquisition memory 204 for use by the test and measurement instrument 200.

Figure 5:
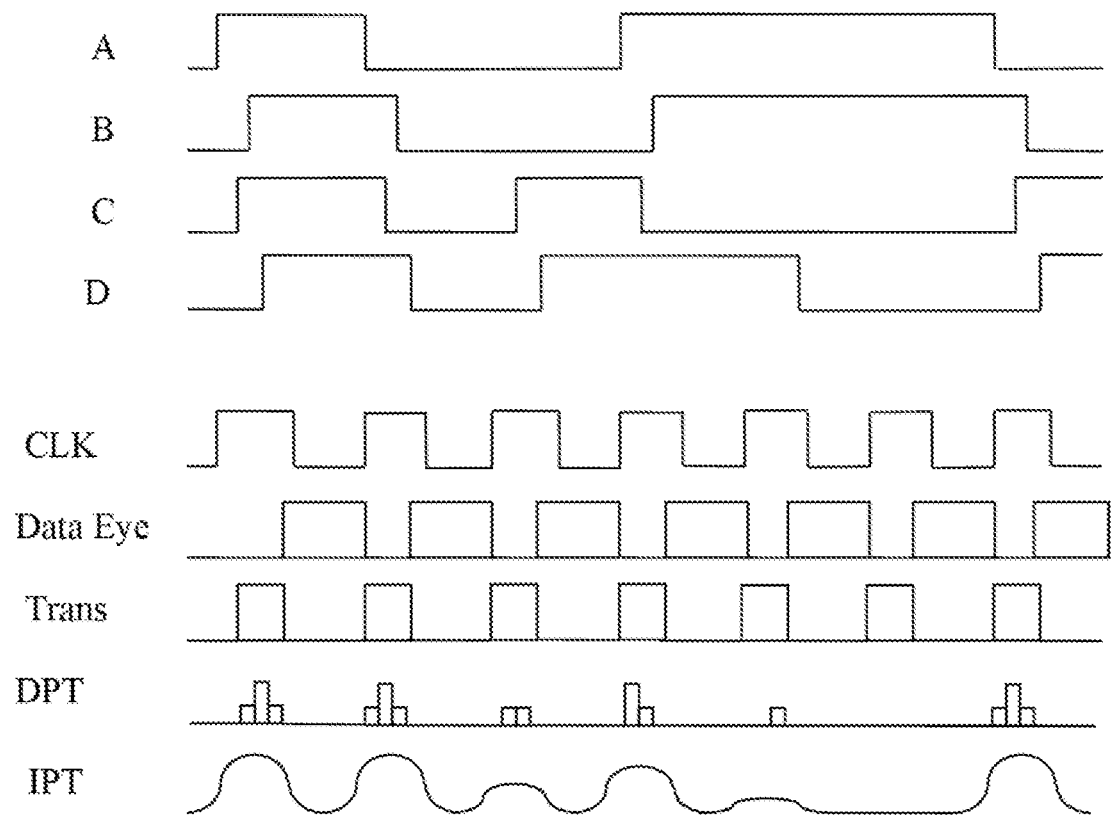
FIG. 5 is a diagram of example waveforms that may be used in a method for recovering a clock from a data waveform.

As mentioned above, one method that may be used to determine the external clock is an ISD method. The example in FIG. 5 illustrates a set of four digital input signals (A, B, C, and D). They are a four bit field that a user wants to visualize as a four bit entity rather than four independent digital inputs. Four signals are used here to simplify the example, but some applications may require groups of eight digital channels. The input signals A, B, C, and D are clocked in a device under test's system by a nominal 50 MHz clock. This 50 MHz clock (CLK) is not generally captured by the test and measurement instrument 200 because digital channels on most mixed signal instruments are grouped in sets of eight, leaving no room for a synchronization signal. Also, most instruments with digital capabilities are not capable of synchronizing their sampling engine to an external clock even if it were directly probed. The digital acquisition system capturing these digital inputs simply samples at 500 MS/s (asynchronous to the input). Due to propagation skew, threshold inaccuracies, and asynchronous sampling, the transitions on the input signals corresponding to a user's 50 MHz clock do not always appear coincident in a sample memory of a test and measurement instrument 200.

The "Data Eye" in FIG. 5 illustrates the points in the four-bit wide digital data when the test and measurement instrument's 500 GS/s samples for all of the digital channels are stable and represent the logic state for the same device under test clock period. A simple sequence of fast asynchronous samples of digital instrument inputs will contain false codes around the transition times, and will not accurately represent the device under test's stream of codes. What is needed is a way to analyze the input data, determine the device under test's clock period, and recover the device under test's sample stream in the user's clock domain. This may allow the test and measurement instrument 200 to display the digital data in an analog format and allow a user to use all of the existing analog functions and features (measurements, math, etc.) on any set of digital inputs and have them time correlated to all other instrument inputs. The inputs would not need to be limited to ADC output codes. They could be address lines (for memory use code optimization), outstanding transaction counts for logic debug or optimization, or any diagnostic "thermometer code" within a digital system. The possibilities for enabling device under test system level visualization are endless.

Since test and measurement instruments 200 generally capture digital data at rates much faster than board level signaling technologies support, the test and measurement instrument 200 will oversample this data and a smart decimation of the oversampled data should allow recovery of the sample stream in the device under test's clock domain. A selective decimation of the oversampled data that results in the device under test's sample stream will be referred to as input synchronous decimation (ISD).

Ideally the user would enter the user clock period into the user interface of the test and measurement instrument 200 and the test and measurement instrument 200 would walk through the digital acquisition grabbing samples at the specified interval to create an ISD data stream. This is not a practical possibility for acquisitions of any significant length, however. The user will likely not know how far the device under test clock period is off from nominal and the instrument's acquisition system will introduce its own sampling tolerance errors that the user will be blind to. What is needed is a way to use the nominal clock frequency input (NCF) from the user in concert with data extracted from the acquisition itself to determine each appropriate sample point.

Referring back to FIG. 5, the transitions on the input signals A, B, C, and D occur during the times indicated by the "Trans" waveform. This assumes that the supplied NCF was used to ensure that the test and measurement instrument 200 is sampling fast enough to provide adequate oversampling before acquisition time. If a test and measurement instrument 200 were to capture these digital signals into oversampled memory, it could post process the digital acquisition in the same way analog acquisitions are post processed and redisplayed for functions such as MATH. In this case, the redisplayed signal would be a generated analog signal. The post processing would start with the creation of a Digital Pulse Train (DPT). The DPT is a pseudo-signal comprised of transition counts. Each sample in the 500 GS/s domain is analyzed to see if a transition occurred on any of the digital channels. For each digital signal that transitioned on a specific sample, the effective digital-to-analog converter code for the corresponding sample in the DPT waveform is incremented by [256/(number of digital channels)]. The 256 figure is used to create a resulting waveform that can easily be analyzed using the same functions a test and measurement instrument 200 uses to analyze eight bit digital-to-analog converter codes. It is not strictly necessary and unity normalization may be used instead. Interpolation on the DPT waveform results in the Interpolated Pulse Train (IPT) waveform.

A fast Fourier transform (FFT) may be performed on the IPT waveform to extract frequency content. The frequency harmonic found closest to the NCF is used as the User Sample Frequency corresponding to the User Sample Period (USP). The USP can be determined with enough accuracy to walk through the entire acquisition grabbing ISD codes at the correct locations. There may be some unavoidable sample error for each ISD sample that is equal to 1 ns or less in our example (oversampling period/2), and this can be considered part of the Data Eye. This USP figure now is a high precision representation of the device under test clock period that takes into account all device under test and test and measurement instrument 200 clock tolerance issues.

The ISD waveform is then constructed by finding the highest peak in the IPT waveform (corresponding to the middle of the most active transition region), moving USP/2 (rounded to the nearest oversample boundary) beyond that point in time, and walking through the original digital acquisition forward and backward grabbing the corresponding sample every USP. The USP figure will need to be kept as a high precision number and all fractional math needs to be carried to insure sample alignment throughout the entire acquisition.

This ISD waveform is now fully representative of the users sample stream. However, it is effectively sampled at the USP rate that will most likely be incompatible with the base sample rate of the instrument's analog channels. Interpolation of the ISD waveform (IISD) into a native analog sample rate may allow the instrument to treat the IISD as any other reference or MATH waveform. It could be displayed, measured, and analyzed in all the same ways conventional analog waveforms are.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Examples

Illustrative examples of the technologies disclosed herein are provided below. An embodiment of the technologies may include any one or more, and any combination of, the examples described below.

Example 1 is an abstracted digital memory acquisition circuit, comprising an analog input configured to receive an analog signal; an analog-to-digital converter configured to receive the analog signal and convert the analog signal to a first digital signal; a digital input configured to receive a second digital signal; a controller configured to receive the first digital signal and the second digital signal and output a stream of bits, the stream of bits including the first digital signal and the second digital signal, and a control signal; and an output configured to electrically connect to a digital input of a test and measurement instrument and output the stream of bits and the control signal.

Example 2 is the abstracted digital memory acquisition circuit of example 1, further comprising a plurality of analog inputs, each analog input configured to receive a respective analog signal; and a plurality of analog-to-digital converters, each of the analog-to-digital converter configured to receive the respective analog signal and convert the analog signal to a respective first digital signal, wherein the controller is configured to receive the respective first digital signals and the second digital signal and output the stream of bits, the stream of bits including the respective first digital signals.

Example 3 is the abstracted digital memory acquisition circuit of either one of examples 1 and 2, further comprising a plurality of digital inputs, each digital input configured to receive a respective second digital signal, wherein the controller is configured to receive the first digital signal and the respective second digital signals and output the stream of bits, the stream of bits including the respective second digital signals.

Example 4 is the abstracted digital memory acquisition circuit of any one of examples 1-3, wherein the control signal includes a trigger signal, and the controller is configured to generate the trigger signal based on the first digital signal or the second digital signal.

Example 5 is the abstracted digital memory acquisition circuit of any one of examples 1-4, wherein the control signal indicates boundaries of a time domain multiplex block.

Example 6 is the abstracted digital memory acquisition circuit of any one of examples 1-5, wherein the analog-to-digital converter and the digital input are sampled on an external clock.

Example 7 is the abstracted digital memory acquisition circuit of any one of examples 1-6, further comprising an encoder, the encoder configured to receive the stream of bits and the control signal, encode the stream of bits and the control signal, and forward the encoded stream of bits and the encoded control signal to the output.

Example 8 is a test and measurement system, comprising the abstracted digital memory acquisition circuit of any one of examples 1-7; and the test and measurement instrument including the digital input, the test and measurement instrument configured to receive the stream of bits and the control signal and recover the first digital signal and the second digital signal based on the stream of bits and the control signal.

Example 9 is the abstracted digital memory acquisition circuit of example 8, wherein the control signal includes a trigger signal, wherein the test and measurement instrument is configured to trigger acquisition of another signal based on the trigger signal.

Example 10 is the abstracted digital memory acquisition circuit of either one of examples 8 and 9, wherein the analog-to-digital converter and the digital input are sampled on an external clock and the test and measurement instrument is further configured to recover the first digital signal and the second digital signal based on the external clock.

Example 11 is a method for acquiring multiple signals by an abstracted digital memory acquisition circuit, comprising receiving an analog signal; converting the analog signal to a first digital signal; receiving a second digital signal; combining the first digital signal and the second digital signal into a stream of bits, the stream of bits including the first digital signal and the second digital signal, and a control signal; generating a control signal, the control signal indicating a boundary of blocks of the first digital signal and the second digital signal in the stream of bits; and transmitting to a digital input of a test and measurement instrument the stream of bits and the control signal.

Example 12 is the method of example 11, further comprising receiving a plurality of analog signals; and converting each analog signal to a respective first digital signal; and combining the respective first digital signals and the second digital signal into a stream of bits.

Example 13 is the method of either one of examples 11 or 12, further comprising receiving a plurality of respective second digital signals, and combining the first digital signal and the respective second digital signals into a stream of bits.

Example 14 is the method of any one of examples 11-13 wherein the control signal includes a trigger signal, and generating the control signal includes generating the trigger signal based on the first digital signal or the second digital signal.

Example 15 is the method of any one of examples 11-14, wherein the control signal indicates boundaries of a time domain multiplex block.

Example 16 is the method of any one of examples 11-15, wherein first digital signal and the second digital signal are sampled on an external clock.

Example 17 is the method of any one of examples 11-16, further comprising encoding the stream of bits and the control signal prior to being transmitted.

Example 18 is the method of any one of examples 11-17, further comprising receiving the stream of bits and the control signal and recover the first digital signal and the second digital signal based on the stream of bits and the control signal.

Example 19 is the method of example 18, wherein the control signal includes a trigger signal, further comprising triggering acquisition of another signal based on the trigger signal.

Example 20 is the method of example 18, wherein the analog-to-digital converter and the digital input are sampled on an external clock and further comprising recovering the first digital signal and the second digital signal based on the external clock.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

I claim:

1. An abstracted digital memory acquisition circuit to electrically connect between one or more devices under test and a test and measurement instrument, comprising:
   an analog input configured to receive an analog signal output from the one or more devices under test;
   an analog-to-digital converter configured to receive the analog signal and convert the analog signal to a first digital signal;
   a digital input configured to receive a second digital signal output from the one or more devices under test;
   a controller configured to receive the first digital signal and the second digital signal and output a stream of bits, the stream of bits including the first digital signal and the second digital signal, and a control signal; and
   an output configured to electrically connect to a digital input of the test and measurement instrument and output the stream of bits and the control signal;
   wherein the analog input and the digital input of the abstracted digital memory acquisition circuit provide expanded inputs for the test and measurement instrument.

2. The abstracted digital memory acquisition circuit of claim 1, further comprising:
   a plurality of analog inputs, each analog input configured to receive a respective analog signal; and
   a plurality of analog-to-digital converters, each of the analog-to-digital converter configured to receive the respective analog signal and convert the analog signal to a respective first digital signal,
   wherein the controller is configured to receive the respective first digital signals and the second digital signal and output the stream of bits, the stream of bits including the respective first digital signals.

3. The abstracted digital memory acquisition circuit of claim 1, further comprising a plurality of digital inputs, each digital input configured to receive a respective second digital signal, wherein the controller is configured to receive the first digital signal and the respective second digital signals and output the stream of bits, the stream of bits including the respective second digital signals.

4. The abstracted digital memory acquisition circuit of claim 1, wherein the control signal includes a trigger signal, and the controller is configured to generate the trigger signal based on the first digital signal or the second digital signal.

5. The abstracted digital memory acquisition circuit of claim 1, wherein the control signal indicates boundaries of a time domain multiplex block.

6. The abstracted digital memory acquisition circuit of claim 1, wherein the analog-to-digital converter and the digital input are sampled on an external clock.

7. The abstracted digital memory acquisition circuit of claim 1, further comprising an encoder, the encoder configured to receive the stream of bits and the control signal, encode the stream of bits and the control signal, and forward the encoded stream of bits and the encoded control signal to the output.

8. A test and measurement system, comprising:
an abstracted digital memory acquisition circuit including
an analog input configured to receive an analog signal,
an analog-to-digital converter configured to receive the analog signal and convert the analog signal to a first digital signal,
a digital input configured to receive a second digital signal,
a controller configured to receive the first digital signal and the second digital signal and output a stream of bits, the stream of bits including the first digital signal and the second digital signal, and a control signal, and
an output configured to output the stream of bits and the control signal; and
a test and measurement instrument including
a first digital input configured to receive the stream of bits and the control signal, in which the test and measurement instrument is configured to recover the first digital signal and the second digital signal based on the stream of bits and the control signal.

9. The test and measurement system of claim 8, wherein the control signal includes a trigger signal, wherein the test and measurement instrument is configured to trigger acquisition of another signal based on the trigger signal.

10. The test and measurement system of claim 8, wherein the analog-to-digital converter and the digital input are sampled on an external clock and the test and measurement instrument is further configured to recover the first digital signal and the second digital signal based on the external clock.

11. A method for acquiring multiple signals by an abstracted digital memory acquisition circuit to electrically connect between one or more devices under test and a test and measurement instrument, comprising:
receiving an analog signal output from the one or more devices under test;
converting the analog signal to a first digital signal;
receiving a second digital signal output from the one or more devices under test;
combining the first digital signal and the second digital signal into a stream of bits, the stream of bits including the first digital signal and the second digital signal, and a control signal;
generating a control signal, the control signal indicating a boundary of blocks of the first digital signal and the second digital signal in the stream of bits; and
transmitting to a digital input of the test and measurement instrument the stream of bits and the control signal;
wherein the analog input and the digital input of the abstracted digital memory acquisition circuit provide expanded inputs for the test and measurement instrument.

12. The method of claim 11, further comprising:
receiving a plurality of analog signals; and
converting each analog signal to a respective first digital signal; and
combining the respective first digital signals and the second digital signal into a stream of bits.

13. The method of claim 11, further comprising:
receiving a plurality of respective second digital signals, and
combining the first digital signal and the respective second digital signals into a stream of bits.

14. The method of claim 11, wherein the control signal includes a trigger signal, and generating the control signal includes generating the trigger signal based on the first digital signal or the second digital signal.

15. The method of claim 11, wherein the control signal indicates boundaries of a time domain multiplex block.

16. The method of claim 11, wherein first digital signal and the second digital signal are sampled on an external clock.

17. The method of claim 11, further comprising encoding the stream of bits and the control signal prior to being transmitted.

18. The method of claim 11, further comprising receiving the stream of bits and the control signal and recovering the first digital signal and the second digital signal based on the stream of bits and the control signal.

19. The method of claim 18, wherein the control signal includes a trigger signal, further comprising triggering acquisition of another signal based on the trigger signal.

20. The method of claim 18, wherein the analog-to-digital converter and the digital input are sampled on an external clock and further comprising recovering the first digital signal and the second digital signal based on the external clock.

* * * * *